(12) United States Patent
Yu et al.

(10) Patent No.: US 9,301,428 B2
(45) Date of Patent: Mar. 29, 2016

(54) DISPLAY APPARATUS

(71) Applicant: Samsung Display Co., Ltd., Yongin, Gyeonggi-Do (KR)

(72) Inventors: Hanyul Yu, Asan-si (KR); Joo Hyuk Park, Asan-si (KR); Su-Young Yun, Asan-si (KR); JeongJin Park, Cheonan-si (KR); Kyungwon Lee, Gwangmyeong-si (KR); Yoonki Hong, Gunpo-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 393 days.

(21) Appl. No.: 13/869,507

(22) Filed: Apr. 24, 2013

(65) Prior Publication Data

US 2014/0169033 A1 Jun. 19, 2014

(30) Foreign Application Priority Data

Dec. 18, 2012 (KR) .................. 10-2012-0148744

(51) Int. Cl.
*F21V 8/00* (2006.01)
*H05K 13/00* (2006.01)
*H05K 5/00* (2006.01)
*H05K 7/20* (2006.01)
*G02F 1/1333* (2006.01)
*G02F 1/1345* (2006.01)

(52) U.S. Cl.
CPC .......... *H05K 7/20409* (2013.01); *G02F 1/1345* (2013.01); *G02F 1/133385* (2013.01); *H05K 5/0017* (2013.01); *H05K 13/00* (2013.01); *G02B 6/0085* (2013.01); *G02F 2001/13332* (2013.01); *Y10T 29/49117* (2015.01); *Y10T 29/49128* (2015.01)

(58) Field of Classification Search
CPC ............ H04N 5/7408; H05K 7/20409; H05K 5/0017; H05K 13/00; G02F 1/133382; G02F 1/13452; G02F 1/133308; G02F 1/133385; G02F 2001/13332; G02F 2001/133314
USPC ........... 362/611, 632–634, 373, 97.1; 349/58, 349/65, 150
See application file for complete search history.

(56) References Cited

U.S. PATENT DOCUMENTS

| | | | |
|---|---|---|---|
| 6,525,786 B1* | 2/2003 | Ono ................................ | 349/40 |
| 7,633,576 B2* | 12/2009 | Byun .............................. | 349/58 |
| 2006/0262241 A1* | 11/2006 | Jeong ............................. | 349/58 |
| 2007/0001931 A1 | 1/2007 | Ma | |
| 2009/0034179 A1 | 2/2009 | Choi et al. | |

(Continued)

FOREIGN PATENT DOCUMENTS

| | | |
|---|---|---|
| JP | 2009-014900 A | 1/2009 |
| JP | 2009-147599 A | 7/2009 |
| JP | 2010-044223 A | 2/2010 |
| KR | 10-0853711 B1 | 8/2008 |
| KR | 1020080093737 A | 10/2008 |
| KR | 1020090070944 A | 7/2009 |

(Continued)

*Primary Examiner* — Anh Mai
*Assistant Examiner* — Arman B Fallahkhair
(74) *Attorney, Agent, or Firm* — Cantor Colburn LLP (57) ABSTRACT

In a display apparatus, a display panel displays an image, and a driver is electrically connected to the display panel and applies a control signal to the display panel to control an operation of the display panel. A first cover member includes a nonmetal material and covers the display panel. An opening is defined in the first cover member and exposes a display area of the display panel. A heat discharge member is coupled to the first cover member and contacts the driver to discharge a heat generated by the driver.

19 Claims, 9 Drawing Sheets

(56) References Cited

U.S. PATENT DOCUMENTS

| | | |
|---|---|---|
| 2011/0235286 A1 | 9/2011 | Kitayama et al. |
| 2012/0044650 A1 | 2/2012 | Kim et al. |
| 2012/0327328 A1* | 12/2012 | Kim et al. .................... 349/59 |
| 2013/0169890 A1* | 7/2013 | Kuromizu .................... 348/790 |

FOREIGN PATENT DOCUMENTS

| | | |
|---|---|---|
| KR | 1020110051106 A | 5/2011 |
| KR | 1020110099865 A | 9/2011 |
| KR | 1020120064424 A | 6/2012 |
| WO | WO 2012035894 A1 * | 3/2012 |

* cited by examiner

DISPLAY APPARATUS

This application claims priority to Korean Patent Application No. 10-2012-0148744, filed on Dec. 18, 2012, and all the benefits accruing therefrom under 35 U.S.C. §119, the contents of which are hereby incorporated by reference.

BACKGROUND

1. Field

The invention relates to a display apparatus. More particularly, the invention relates to a display apparatus capable of discharging a heat generated during a driving operation thereof to the outside thereof.

2. Description of the Related Art

In general, a display apparatus includes a display panel, and a driver which applies a control signal to the display panel. The driver includes a driving circuit board and a flexible printed circuit board. The driving circuit board includes a connector connected to a source voltage cable, and plural circuit elements mounted on the driving circuit board and used to generate the control signal. The flexible printed circuit board is electrically connected between the driving circuit board and the display panel to transmit the control signal to the display panel from the driving circuit board. In addition, the flexible printed circuit board has flexibility, and thus the flexible printed circuit board is bent while being coupled to the driving circuit board and the display panel, thereby reducing an overall volume of the display apparatus.

SUMMARY

One or more exemplary embodiment of the invention provides a display apparatus having an improved heat discharge characteristic, and reducing or effectively preventing an external member thereof from being deformed due to a heat generated while the display apparatus is driven.

An exemplary embodiment of the invention provides a display apparatus including a display panel which displays an image in a display area thereof; a driver which is electrically connected to the display panel, and applies a control signal to the display panel and controls an operation of the display panel; a first cover member which covers the display panel and includes a nonmetal material, and an opening which is defined in the first cover member and exposes the display area of the display panel; and a heat discharge member which is coupled to the first cover member, contacts the driver and discharges a heat from the driver.

According to the above, the heat generated from the driving chip of the driver may be easily discharged to the outside of the display apparatus using the heat discharge member coupled to a rib extended from a cover portion of the first cover member. Accordingly, although the first cover member includes a plastic material, the heat may be easily discharged to the outside of the display apparatus through the heat discharge member, thereby reducing or effectively preventing deformation of the first cover member.

BRIEF DESCRIPTION OF THE DRAWINGS

The above and other features of the invention will become readily apparent by reference to the following detailed description when considered in conjunction with the accompanying drawings where.

DETAILED DESCRIPTION

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" other elements or features would then be oriented "upper" the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

When a display apparatus is driven for a relatively long time, heat is generated from a driver of the display apparatus which applies a control signal to a display panel of the display apparatus. Particularly, among circuit elements mounted on a driving circuit board of the driver, a driving chip provided with an integrated circuit generates high heat during an operation process thereof. The heat exerts a significant influence on reliability of the operation of the display apparatus and causes deformation of other elements arranged adjacent to the driving chip, specifically elements including a plastic material.

Hereinafter, the invention will be explained in detail with reference to the accompanying drawings.

Figure 1:
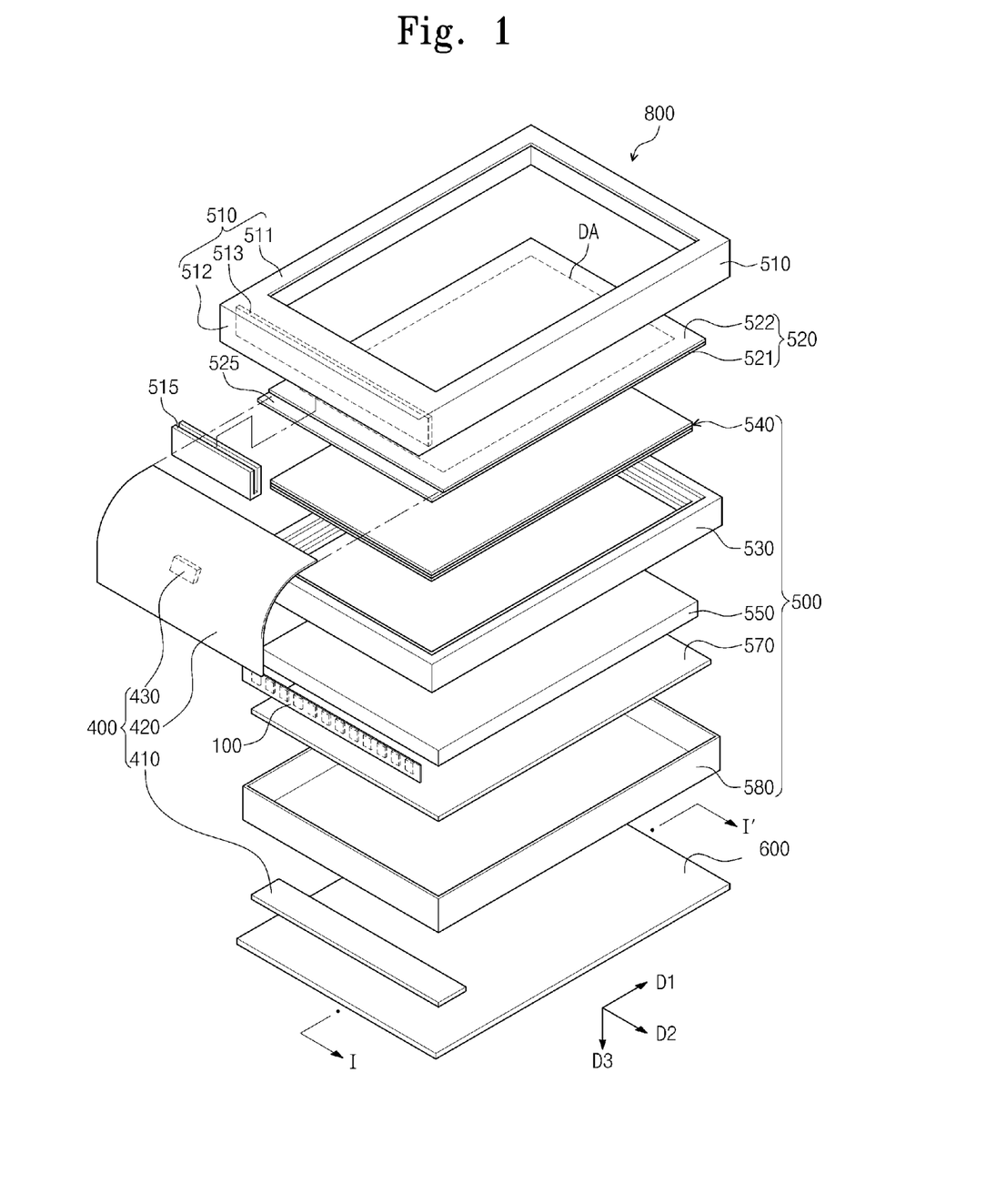
FIG. 1 is an exploded perspective view showing an exemplary embodiment of a display apparatus according to the invention.
Figure 2A:
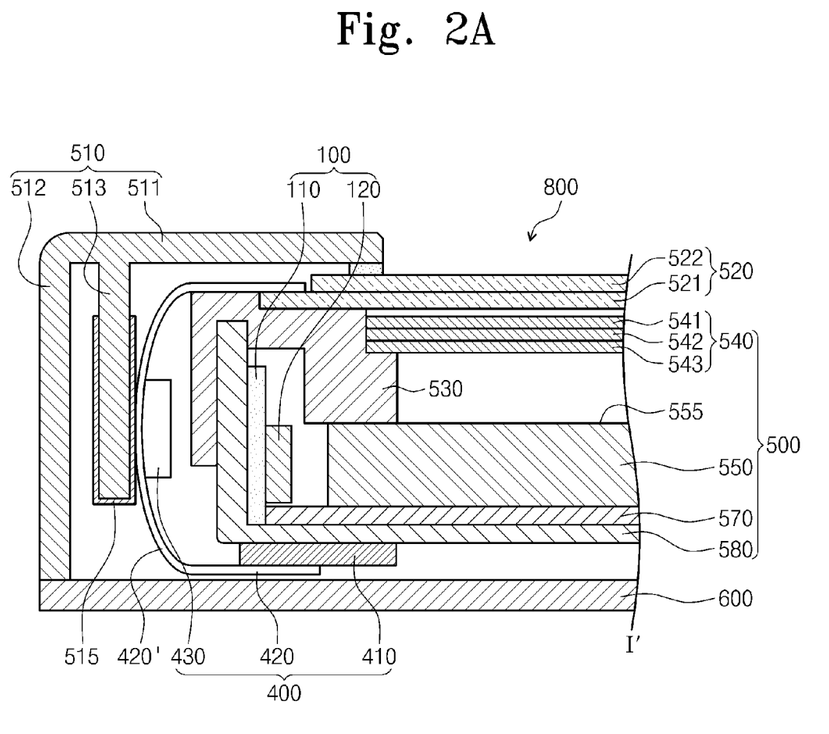
FIG. 2A is a cross-sectional view taken along line I-I' of FIG. 1.
Figure 2B:
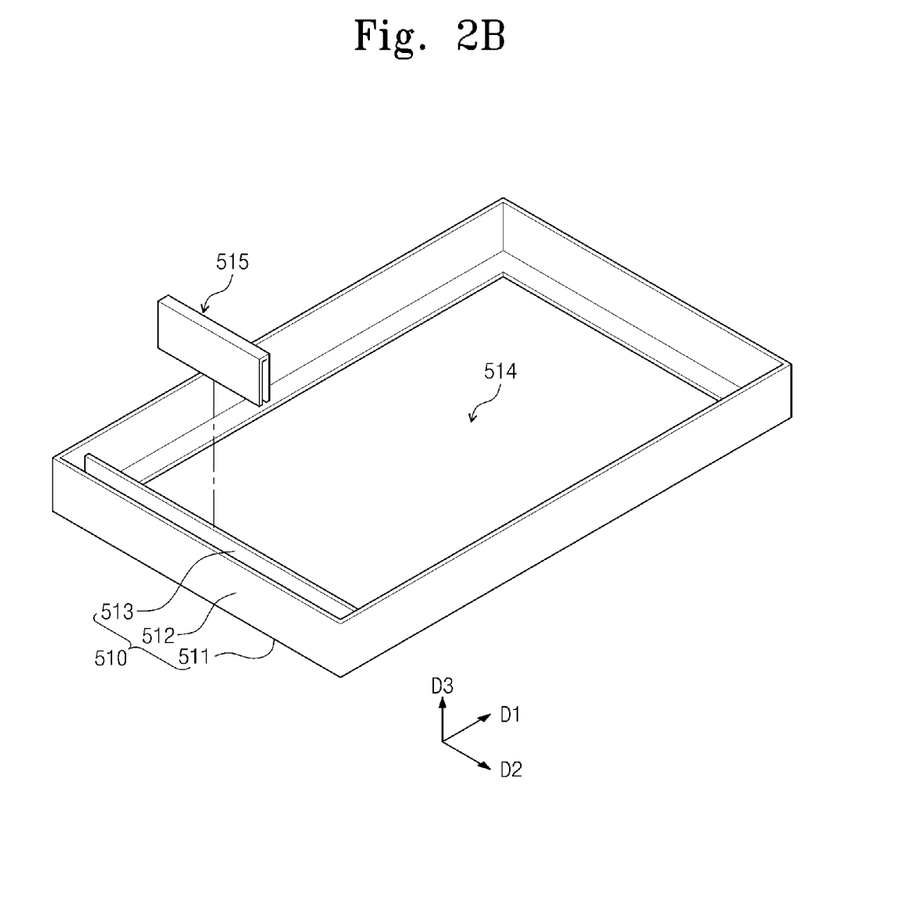
FIG. 2B is an exploded perspective view showing an exemplary embodiment of a first cover member and a discharge member shown in FIG. 1.

FIG. 1 is an exploded perspective view showing an exemplary embodiment of a display apparatus according to the invention, FIG. 2A is a cross-sectional view taken along line I-I' of FIG. 1, and FIG. 2B is an exploded perspective view showing an exemplary embodiment of a first cover member and a heat discharge member of FIG. 1. In detail, FIG. 2B shows the first cover member in an upside down state, that is, exposing a rear thereof.

Referring to FIGS. 1, 2A, and 2B, a display apparatus 800 includes a display panel 520, a backlight assembly 500, a driver 400, a first cover member 510, a heat discharge member 515 and a second cover member 600.

The display panel 520 includes a display area DA, and the display panel 520 receives a light from the backlight assembly 500 to display an image in the display area DA. In the illustrated exemplary embodiment, the display panel 520 may be, but is not limited to, a liquid crystal display panel. Where the display panel 520 is the liquid crystal display panel, the display panel 520 includes a first substrate 521 including one or more pixel electrode, a second substrate 522 including a common electrode facing the pixel electrode, and a liquid crystal layer (not shown) interposed between the first substrate 521 and the second substrate 522.

The display panel 520, however, should not be limited to the liquid crystal display panel. In exemplary embodiments, for instance, the display panel 520 may be another type of display panel, such as an organic electroluminescent display panel, an electrowetting display panel, a nano-crystal display panel, etc. Where the display panel 520 is the organic electroluminescent display panel, the backlight assembly 500 may be omitted from the display apparatus 800 since the organic electroluminescent display panel is a self-emissive display panel.

The backlight assembly 500 provides a light to the display panel 520. The backlight assembly 500 includes a light emitting unit 100, a bottom chassis 580, a reflection plate 570, a light guide plate 550, a mold frame 530 and a plurality of sheets 540.

The light emitting unit 100 generates and emits the light. In the illustrated exemplary embodiment, the light emitting unit 100 includes a printed circuit board 110, and one or more point light source such as a light emitting diode 120 mounted on the printed circuit board 110 to generate the light. The printed circuit board 110 is elongated to extend along a side surface among side surfaces of the light guide plate 550, and the light emitting diode 120 is mounted on the printed circuit board 110 and arranged along the side surface of the light guide plate 550. Thus, the light generated from the light emitting diodes 120 is incident to the light guide plate 550 through the side surface which may otherwise be referred to as a light incident surface of the light guide plate 550.

In the illustrated exemplary embodiment, the light emitting unit 100 is arranged adjacent to only one of the side surfaces of the light guide plate 550, however, should not be limited thereto or thereby. In exemplary embodiments, for instance, the light emitting unit 100 may be provided in a plural number and may be further arranged adjacent to a side opposing the one side surfaces of the light guide plate 550.

The bottom chassis 580 includes a bottom portion, and one or more sidewall extended from the bottom portion to provide a receiving space in which elements of the backlight assembly 500 are accommodated. In the illustrated exemplary embodiment, the reflection plate 570, the light guide plate 550 and the sheets 540 are sequentially stacked on the bottom portion of the bottom chassis 580.

The light guide plate 550 receives the light emitted from the light emitting unit 100 and guides the light to the display panel 520. In detail, after the light is incident to the light guide plate 550, a path of the incident light is changed such as by light exiting patterns of a concavo-convex shape disposed on a rear surface of the light guide plate 550, and the incident light exits through a light exit surface 555 of the light guide plate 550 to be provided to the display panel 520.

The mold frame 530 is coupled to the bottom chassis 580 to fix an edge of the light guide plate 550 to the bottom chassis 580. The mold frame 530 has a step difference portion having a stepped shape inside thereof, such as including multiple steps. The sheets 540 and the display panel 520 are disposed on the step difference portion of the mold frame 530. However, the mold frame 530 should not be limited to the above-mentioned structure. In exemplary embodiments, for instance, the sheets 540 are disposed on the light guide plate 550, and the mold frame 530 is disposed on the sheets 540 to be coupled to the bottom chassis 580. Where the mold frame 530 is disposed on the sheets 540 and the light guide plate 550 and coupled to the bottom chassis 580, the light guide plate 550 and the sheets 540 are fixed to the bottom chassis 580 by the mold frame 530.

The sheets 540 are disposed between the display panel 520 and the light guide plate 550. The sheets 540 include optical sheets to control the path of the light, which is incident to the display panel 520 after exiting from the light exit surface 555 of the light guide plate 550. In detail, the sheets 540 include an upper diffusion sheet 541 and a lower diffusion sheet 543 to diffuse the light exiting from the light guide plate 550, and a prism sheet 542 to condense the light exiting from the light guide plate 550.

The driver 400 is electrically connected to a pad part 525 of the display panel 520 to provide the control signal used to control an operation of the display panel 520 to the display panel 520. The pad part 525 may be a portion of the first substrate 521 which is exposed by the second substrate 522. The driver 400 includes a driving circuit board 410, a flexible printed circuit board 420 and a driving chip 430.

The driving circuit board 410 may include a timing controller (not shown) thereon or integrated therewith, or may be electrically connected to another printed circuit board (not shown) on which the timing controller is mounted. The driving circuit board 410 receives a source voltage from an external source (not shown) to generate the control signal. A first end of the flexible printed circuit board 420 is physically and/or electrically connected to the driving circuit board 410, and an opposing second end of the flexible printed circuit board 420 is physically and/or electrically connected to the display panel 520 to apply the control signal generated from the driving circuit board 410 to the display panel 520. In addition, the driving chip 430 is mounted on the flexible printed circuit board 420 and generates data voltages in response to the control signal to drive pixels arranged in the display panel 520.

Hereinafter, structural characteristics of the driving circuit board 410, the flexible printed circuit board 420 and the driving chip 430 will be described. In the illustrated exemplary embodiment, the driving circuit board 410 is interposed between the bottom chassis 580 and the second cover member 600, and faces the display panel 520 while interposing the backlight assembly 500 therebetween. In another exemplary embodiment, the driving circuit board 410 may be arranged adjacent to one side of the display panel 520 or the light guide plate 550. Where the driving circuit board 410 is arranged adjacent to one side of the display panel 520 or the light guide plate 550, the driving circuit board 410 is arranged substantially perpendicular to the display panel 520 and the light guide plate 550.

The flexible printed circuit board 420 includes a base film, and wires that are disposed on the base film to transmit the control signal generated from the driving circuit board 410. Since the base film is flexible and may include a plastic film, the flexible printed circuit board 420 has a flexibility to be bent in a direction in which an external force is applied.

In addition, the flexible printed circuit board 420 is bent along a side portion of the display panel 520 and a side portion of the backlight assembly 500 since the display panel 520 is disposed on the backlight assembly 500, the driving circuit board 410 is disposed under the backlight assembly 500, and the flexible printed circuit board 420 electrically connects the display panel 520 to the driving circuit board 410. When defining a portion of the flexible printed circuit board 420 which is bent, as a bent portion 420', the bent portion 420' is accommodated between the side portion of the backlight assembly 500 and the first cover member 510 as shown in FIG. 2A.

The driving chip 430 is mounted on the flexible printed circuit board 420. More particularly, the driving chip 430 is mounted on the bent portion 420' of the flexible printed circuit board 420. In the illustrated exemplary embodiment, the driving chip 430 is mounted on the flexible printed circuit board 420 in a chip on film ("COF") method, but should not be limited thereto or thereby. The driving chip 430 is spaced apart from the side portion of the backlight assembly 500.

An opening 514 is defined in the first cover member 510. The opening 514 exposes the display area DA of the display panel 520 and covers (e.g., overlaps) an edge of the display panel 520 except for the display area DA. Such an area except for the display area DA may also be referred to as a non-display area. Also, the first cover member 510 is coupled to the second cover member 600 to accommodate the display panel 520, the backlight assembly 500 and the driver 400 therein. Hereinafter, a structure of the first cover member 510 will be described in detail.

The first cover member 510 includes a cover portion 511, a sidewall portion 512 and a rib 513. The cover portion 511 is substantially parallel to the display panel 520, and two sides of the cover portion 511 may be observed in FIG. 2B. The cover portion 511 includes a portion elongated to be extended in a first direction D1, and a portion elongated to be extended in a second direction D2 that is substantially perpendicular to the first direction D1 to cover the edge of the display panel 520, which has sides that are substantially in parallel to the first and second directions D1 and D2.

The sidewall portion 512 is elongated to be extended in a third direction D3 from the cover portion 511 to cover the side portions of the backlight assembly 500. A space is defined between the sidewall portion 512 and the backlight assembly 500. In the illustrated exemplary embodiment, the sidewall portion 512 is extended in the third direction D3 which is substantially perpendicular to the first and second directions D1 and D2, however, the sidewall portion 512 may be bent or inclined from the cover portion 511 in a direction away from the backlight assembly 500 to define a larger space between the sidewall portion 512 and the backlight assembly 500.

The rib 513 is elongated to be extended in the third direction D3 from the cover portion 511 and is spaced apart from the sidewall portion 512 in the first direction D1. The rib 513 may be substantially parallel to the sidewall portion 512 in the third direction D3, but is not limited thereto or thereby. The rib 513 is also elongated in the second direction D2, and may be substantially parallel to the sidewall portion 512 in the second direction D2, but is not limited thereto or thereby. In addition, the rib 513 is arranged closer to the backlight assembly 500 than the sidewall 512 and faces the bent portion 420'.

In the illustrated exemplary embodiment, the first cover member 510 includes a nonmetal material such as plastic. The cover portion 511, the sidewall portion 512 and the rib 513 may be integral with each other in a single, unitary, indivisible first cover member 510. Thus, the cover portion 511, the sidewall portion 512 and the rib 513 include the nonmetal material.

The heat discharge member 515 includes a metal material having heat conductivity, such as copper, aluminum, iron, etc. In the illustrated exemplary embodiment, the heat discharge member 515 has a plate shape and is bent along a surface of the rib 513. More particularly, the heat discharge member 515 has a length in the second direction D2, and is successively extended in the third direction D3, the first direction D1 and an opposite direction to the third direction D3, such that the heat discharge member 525 to be bent along an outer surface of the rib 513. In addition, since the heat discharge member 515 is opened at a side thereof, the rib 513 is inserted in to the opened portion of the heat discharge member 515, such that the heat discharge member 515 is coupled to the rib 513. In the second direction D2, the heat discharge member 515 maybe opened at ends thereof. The heat discharge member 515 may be a single, unitary, indivisible member, but is not limited thereto or thereby.

In another exemplary embodiment of the invention, the heat discharge member 515 may be, but not limited to, a heat conductive tape. The heat conductive tape includes an adhesive layer, and a metal layer that is laminated on the adhesive layer. The metal layer discharges a heat transmitted thereto, and the heat discharge member 515 is attached to the rib 513 and/or the flexible printed circuit board 420 by the adhesive layer. Thus, where the heat discharge member 515 is the heat conductive tape, the heat discharge member 515 has a heat discharge characteristic and an assembling characteristic of the heat discharge member 515 is improved.

As described above, the rib 513 faces the driving chip 430 while interposing the flexible printed circuit board 420 therebetween, and the rib 513 is coupled to the heat discharge member 515 such that the flexible printed circuit board 420 contacts the heat discharge member 515. In detail, when assuming that the flexible printed circuit board 420 includes a first surface and an opposing second surface, and the driving chip 430 is mounted on the first surface, an area of the second surface corresponding to an area where the driving chip 430 is mounted makes contact with the heat discharge member 515.

Therefore, the heat generated when the driving chip 430 is operated is transmitted to the heat discharge member 515 through the flexible printed circuit board 420, and the heat transmitted to the heat discharge member 515 is discharged to the outside thereof through the surface of the heat discharge member 515. In addition, the driving chip 430 is considered to indirectly contact the heat discharge member 515 while interposing the flexible printed circuit board 420 therebetween. Thus, an electrical short phenomenon between the driving chip 430 and the heat discharge member 515 may be reduced or effectively prevented, and direct transmission of an electromagnetic wave or static electricity initially transmitted to the heat discharge member 515 to the driving chip 430 may be reduced or effectively prevented, thereby improving the reliability related to the operation of the display apparatus 800.

Figure 3A:
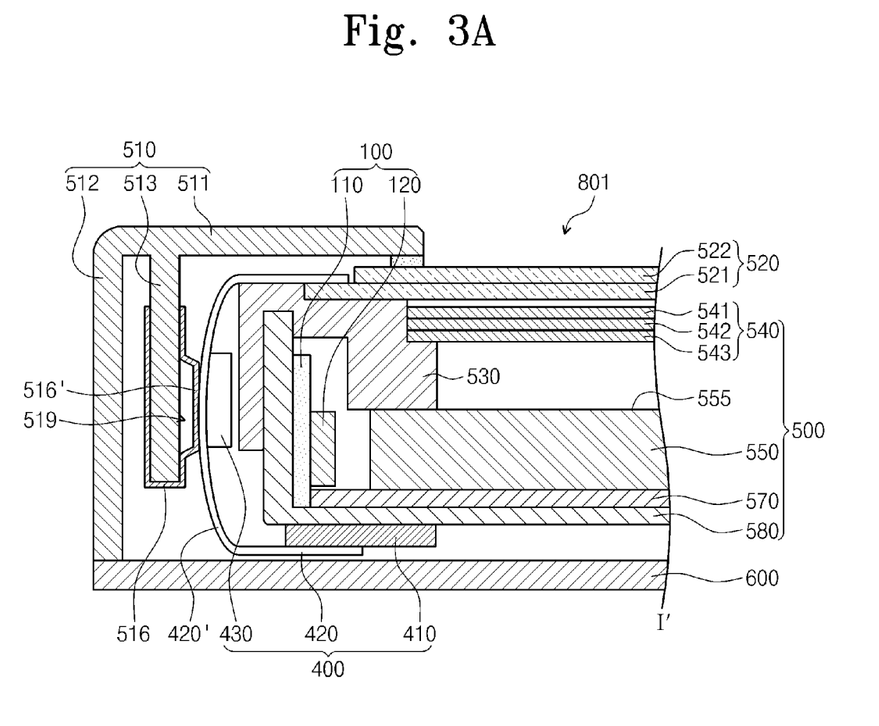
FIG. 3A is a cross-sectional view showing another exemplary embodiment of a display apparatus according to the invention.
Figure 3B:
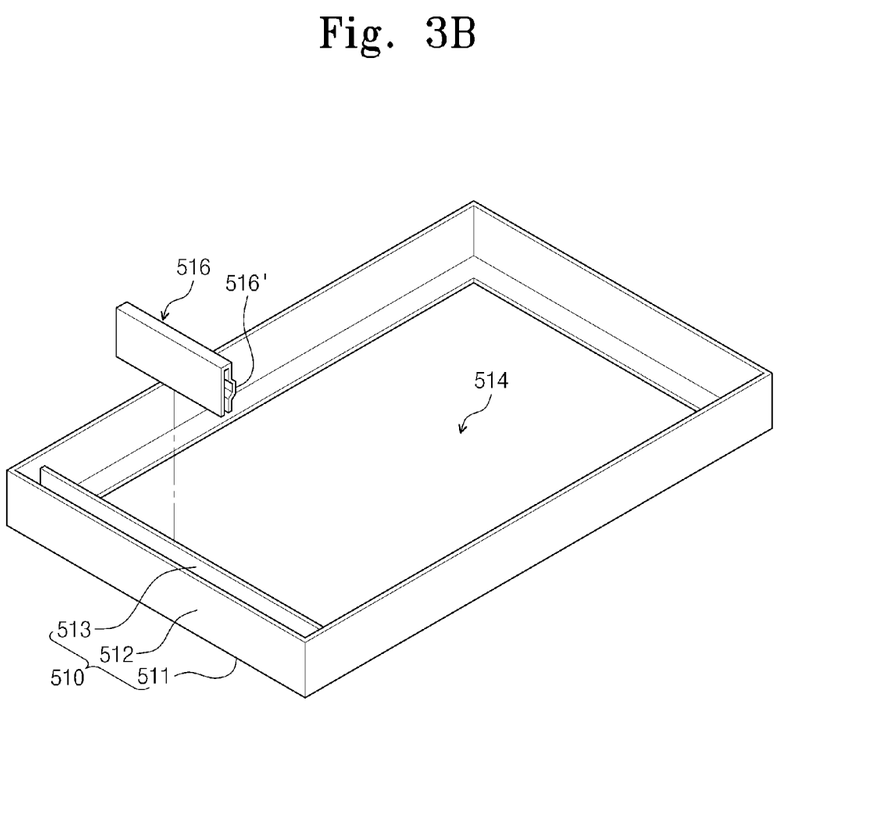
FIG. 3B is an exploded perspective view showing an exemplary embodiment of a first cover member and a heat discharge member shown in FIG. 3A.

FIG. 3A is a cross-sectional view showing another exemplary embodiment of a display apparatus according to the invention, and FIG. 3B is an exploded perspective view showing an exemplary embodiment of a first cover member and a heat discharge member of FIG. 3A. In detail, FIG. 3B shows the first cover member in an upside down state, that is, exposing a rear thereof.

An exemplary embodiment of a display apparatus 801 shown in FIGS. 3A and 3B includes the substantially same elements as those of the display apparatus 800 shown in FIGS. 1, 2A and 2B except for a heat discharge member 516. Therefore, the same reference numerals denote the same elements in FIGS. 1, 2A and 2B, and thus the detailed descriptions of the same elements will be omitted.

Referring to FIGS. 3A and 3B, the display apparatus 801 includes the heat discharge member 516 to discharge a heat generated from the driving chip 430 to the outside thereof.

Similar to the heat discharge member 515 shown in FIG. 2A, the heat discharge member 516 according to the illustrated exemplary embodiment is bent to accommodate the rib 513 therein. The heat discharge member 516 further includes a bent portion 516' to define a space 519 between the heat discharge member 516 and the rib 513. The space 519 may be filled with air, such as to form an air layer space 519, but is not limited thereto or thereby. The portion of the heat discharge member 516 facing the backlight assembly 500 may contact the rib 513 at opposing sides of the space 519, but is not limited thereto or thereby.

A portion of the heat discharge member 516 which forms the bent portion 516' is successively bent in a direction (e.g., the first direction D1) that moves away from the rib 513, in the opposite direction to the third direction D3 and then in a direction that approaches the rib 513 (e.g., in a direction opposite to the first direction D1. Thus, the heat discharge member 516 is spaced apart from the rib 513 at the bent portion 516' and the air layer space 519 is defined between the bent portion 516' and the rib 513. Since the heat discharge member 516 is opened at second direction D2 opposing ends thereof, the space 519 is exposed to outside the heat discharge member 516 and is essentially a ventilation path.

As described above, when the air layer space 519 is defined between the bent portion 516' and the rib 513, the heat generated from the driving chip 430 is transmitted to the heat discharge member 516 and discharged to the outside through the heat discharge member 516. In addition, the heat transmitted to the rib 513 from the heat discharge member 516 through the air layer space 519 is reduced. Consequently, deformation of the rib 513 which includes the plastic material may be reduced or effectively prevented.

In addition, since the air layer space 519 serves as the ventilation path to the surrounding area of the heat discharge member 516, the heat generated from the driving chip 430 and transmitted to the heat discharge member 516 is easily discharged to the surrounding area of the heat discharge member 516 through the air layer space 519, thereby improving a heat discharging effect of the heat discharge member 516.

Figure 4A:
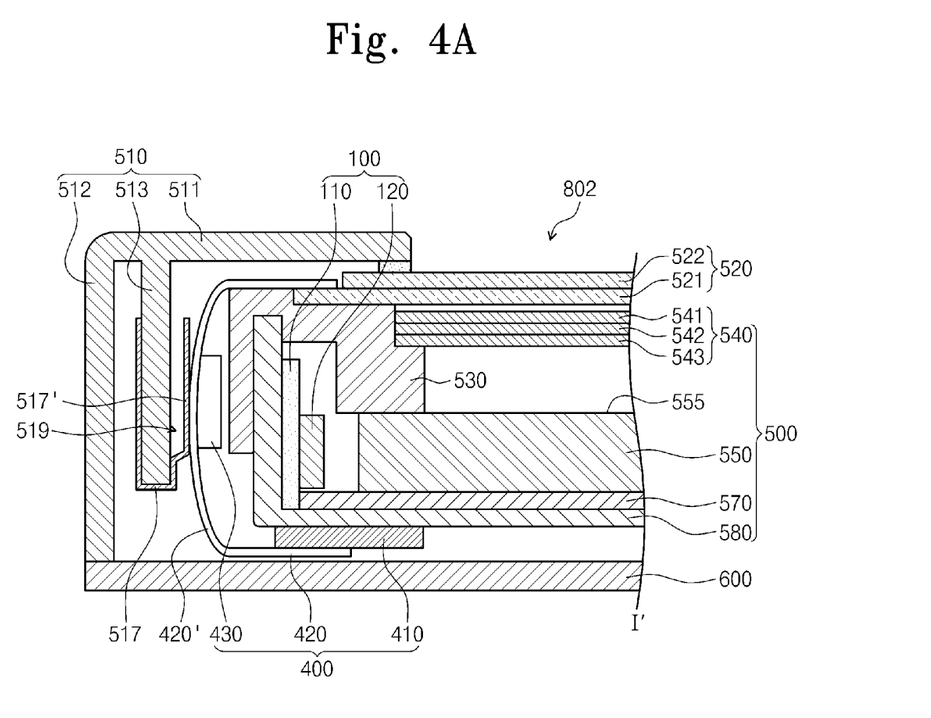
FIG. 4A is a cross-sectional view showing still another exemplary embodiment of a display apparatus according to the invention.
Figure 4B:
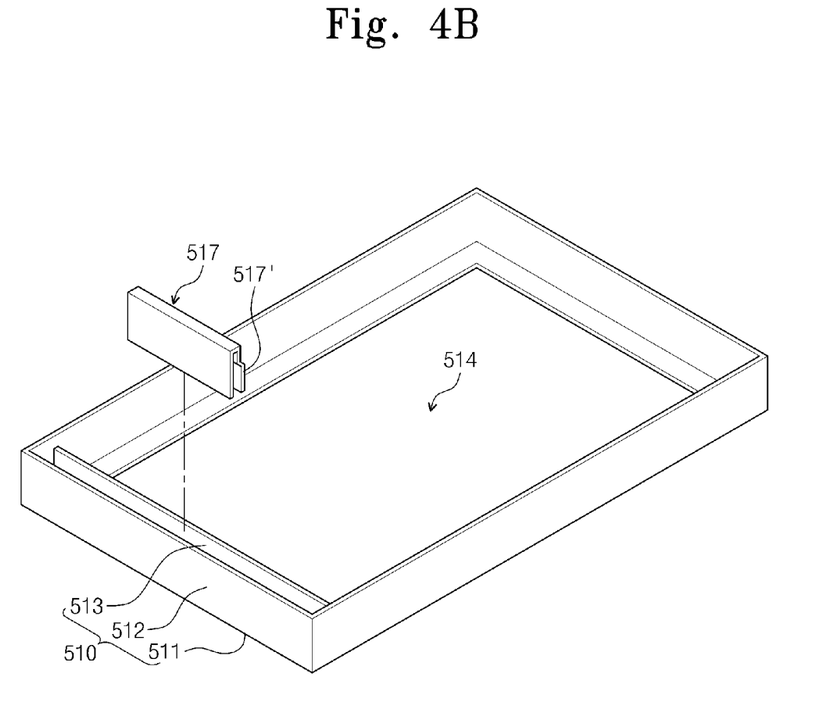
FIG. 4B is an exploded perspective view showing an exemplary embodiment of a first cover member and a heat discharge member shown in FIG. 4A.

FIG. 4A is a cross-sectional view showing still another exemplary embodiment of a display apparatus according to the invention, and FIG. 4B is an exploded perspective view of an exemplary embodiment of a first cover member and a heat discharge member of FIG. 4A. In detail, FIG. 4B shows the first cover member in an upside down state, that is, exposing a rear thereof.

An exemplary embodiment of a display apparatus 802 shown in FIGS. 4A and 4B includes substantially the same elements as those of the display apparatus 800 shown in FIGS. 1, 2A and 2B except for a heat discharge member 517. Therefore, the same reference numerals denote the same elements in FIGS. 1, 2A and 2B, and thus the detailed descriptions of the same elements will be omitted.

Referring to FIGS. 4A and 4B, the display apparatus 802 includes the heat discharge member 517 that discharges a heat generated from the driving chip 430 to the outside thereof.

Similar to the heat discharge member 515 shown in FIG. 2A, the heat discharge member 517 according to the illustrated exemplary embodiment is bent to accommodate the rib 513 therein. The heat discharge member 517 further includes a bent portion 517' to define a space 519 between the heat discharge member 517 and the rib 513. The space 519 may be filled with air, such as to form an air layer space 519, but is not limited thereto or thereby. A portion of the heat discharge member 517 facing the backlight assembly 500 may contact the rib 513 at only one side of the space 519, and be spaced apart from the rib 513 at the opposing side of the space 519, but is not limited thereto or thereby.

The portion of the heat discharge member 517 which forms the bent portion 517' is successively bent in a direction (e.g., the first direction D1) that moves away from the rib 513, and then in the opposite direction to the third direction D3, to have a clip shape. Thus, the heat discharge member 517 is spaced apart from the rib 513 at the bent portion 517' and the air layer space 519 is defined between the bent portion 517' and the rib 513. As described in the exemplary embodiment shown in FIGS. 3A and 3B, the heat transmitted to the rib 513 from the heat discharge member 517 is reduced, and thus deformation of the rib 513 including the plastic material is may be reduced or effectively prevented.

Figure 5A:
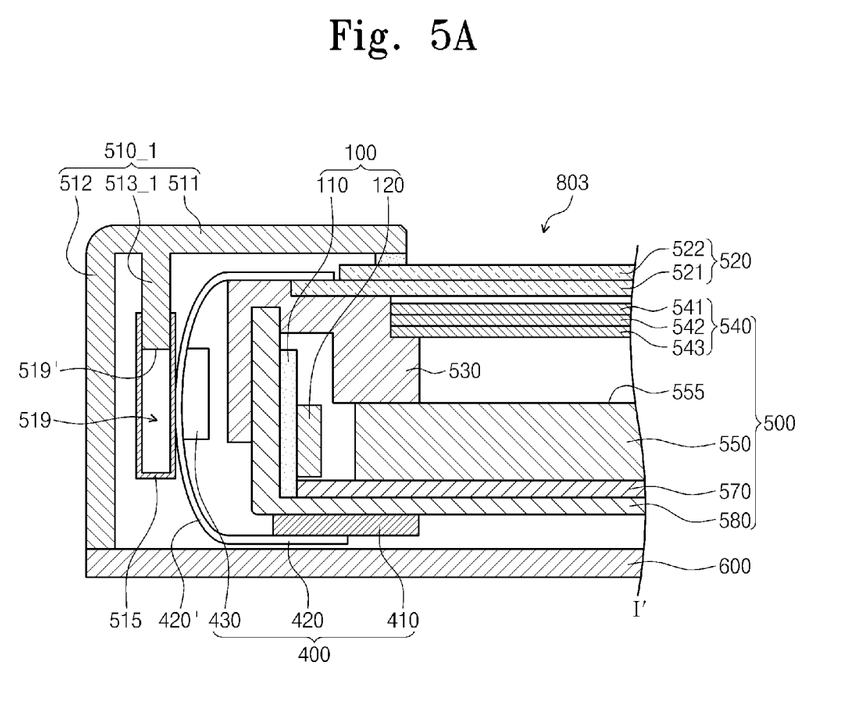
FIG. 5A is a cross-sectional view showing yet another exemplary embodiment of a display apparatus according to the invention.
Figure 5B:
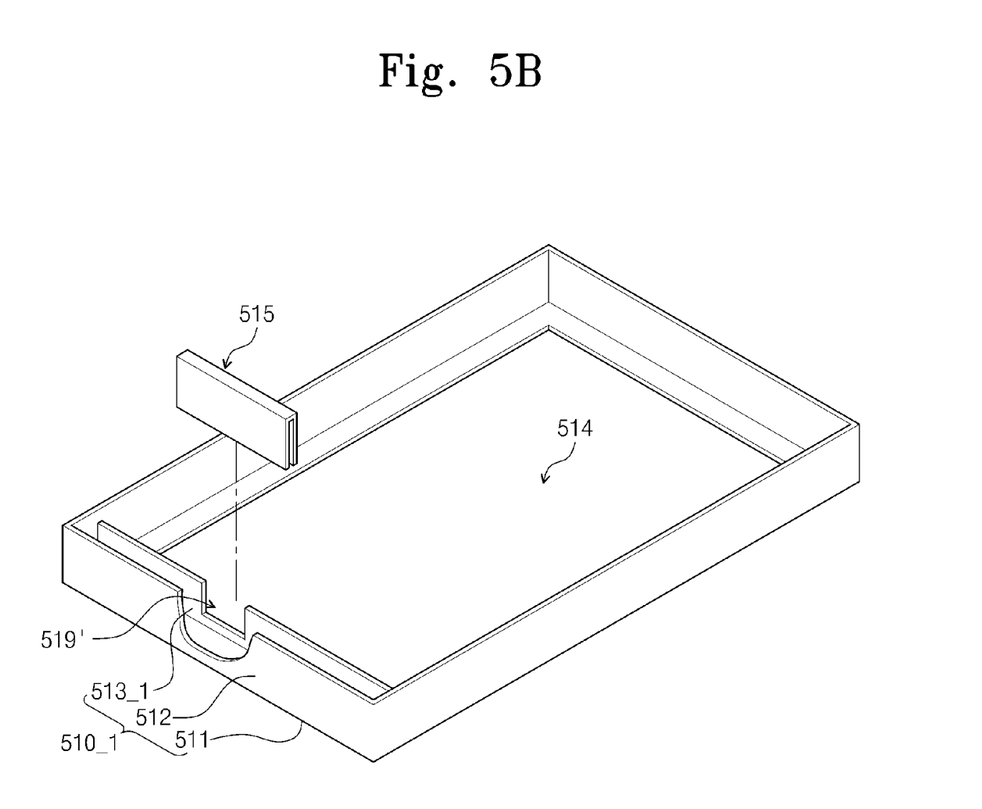
FIG. 5B is an exploded perspective view showing an exemplary embodiment of a first cover member and a heat discharge member shown in FIG. 5A.

FIG. 5A is a cross-sectional view showing yet another exemplary embodiment of a display apparatus according to the invention, and FIG. 5B is an exploded perspective view of an exemplary embodiment of a first cover member and a heat discharge member of FIG. 5A. In detail, FIG. 5B shows the first cover member in an upside down state, that is, exposing a rear thereof.

An exemplary embodiment of a display apparatus 803 shown in FIGS. 5A and 5B includes substantially the same elements as those of the display apparatus 800 shown in FIGS. 1, 2A and 2B except for a first cover member 510_1 and a rib 513_1. In FIGS. 5A and 5B, therefore, the same reference numerals denote the same elements in FIGS. 1, 2A, and 2B, and thus the detailed descriptions of the same elements will be omitted.

Referring to FIGS. 5A and 5B, the display apparatus 803 includes the heat discharge member 515 that discharges a heat generated from the driving chip 430. The first cover member 510_1 includes a cover portion 511, a sidewall portion 512 and the rib 513_1. A cut-away portion 519' is defined in a portion of the rib 513_1 which faces the driving chip 430. In one exemplary embodiment, a portion of the rib 513_1 may be removed to define the cut-away portion 519', not being limited thereto or thereby. Thus, the air layer space 519 is defined between the rib 513_1 and the heat discharge member 515, and a location of the air layer space 519 corresponds to a location of the cut-away portion 519'.

As described above, when the air layer space 519 is defined between the heat discharge member 515 and the rib 513_1, the heat transmitted to the rib 513_1 from the heat discharge member 515 is reduced, and thus deformation of the rib 513_1 including the plastic material is reduced or effectively prevented.

In the illustrated exemplary embodiment, the cut-away portion 519' defined in the rib 513_1 is formed by removing the portion of the rib 513_1. When forming the cut-away portion 519' in the rib 513_1, the rib 513_1 is cut from the distal or terminal side thereof, to thereby easily forming the cut-away portion 519'.

In an exemplary embodiment, a cut-away portion may also be defined in the sidewall portion 512. The cut-away portion defined in the sidewall portion 512 may correspond to the cut-away portion 519' defined in the rib 513_1, such as to provide another ventilation path from the heat discharge member 515. The cut-away portion of the sidewall portion 512 may expose the heat discharge member 515 which is coupled to the rib 513_1 of the first cover member 510_1.

Although exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A display apparatus comprising:
    a display panel which displays an image in a display area thereof;
    a driver which is electrically connected to the display panel, and applies a control signal to the display panel and controls an operation of the display panel;
    a first cover member which covers the display panel and comprises a nonmetal material; and
    a heat discharge member which is coupled to the first cover member, contacts the driver and discharges a heat from the driver,
    wherein
    the first cover member further comprises:
        a cover portion which covers an area of the display panel except for the display area,
        an opening which is defined in the cover portion and exposes the display area of the display panel,
        a side wall portion which is connected with the cover portion and is extended along edges of the cover portion, and
        a rib which is connected with the cover portion and spaced apart from the side wall portion to be coupled to the heat discharge member, the rib defining:
            a first outer surface thereof facing the driver, and
            a second outer surface thereof opposite to the first outer surface thereof; and
    the heat discharge member covers the second outer surface of the rib which is opposite to the first outer surface thereof which faces the driver.

2. The display apparatus of claim 1, wherein the driver comprises:
    a driving circuit board which generates the control signal;
    a flexible printed circuit board which is electrically connected to the driving circuit board and the display panel, transmits the control signal from the driving circuit board to the display panel, and contacts the heat discharge member; and
    a driving chip on the flexible printed circuit board.

3. The display apparatus of claim 2, further comprising:
    a backlight assembly which provides a light to the display panel; and
    a second cover member which is coupled to the first cover member and accommodates the display panel, the driver and the backlight assembly therebetween.

4. The display apparatus of claim 3, wherein
    the backlight assembly comprises:
        a light emitting unit which generates and emits the light;
        a light guide plate which guides the light from the light emitting unit to the display panel; and
        a bottom chassis which accommodates the light emitting unit and the light guide plate therein, and
        the driving circuit board is between the bottom chassis and the second cover member.

5. The display apparatus of claim 3, wherein the flexible printed circuit board extends along a side portion of the backlight assembly.

6. The display apparatus of claim 2, wherein
    the flexible printed circuit board comprises a first surface on which the driving chip is mounted, and a second surface opposite to the first surface, wherein an area of the second surface corresponds to the driving chip and contacts the heat discharge member.

7. The display apparatus of claim 1, wherein the heat discharge member is on both the first and second outer surfaces opposing each other of the rib and coupled to the rib.

8. The display apparatus of claim 7, wherein
    the heat discharge member comprises a bent portion between the flexible printed circuit board and the rib,
    a space is defined between the bent portion and the rib, and
    the heat discharge member contacts the rib at only one side of the space, and a distal end of the heat discharge member is spaced apart from the rib.

9. The display apparatus of claim 7, wherein
    the heat discharge member comprises a bent portion between the flexible printed circuit board and the rib, a space is defined between the bent portion and the rib, and
the heat discharge member contacts the rib at opposing
sides of the space.

10. The display apparatus of claim 1, wherein a cut-away portion is defined in the rib, extending from an end of the rib and facing the driving chip.

11. The display apparatus of claim 10, wherein the cut-away portion is opened at the end of the rib.

12. The display apparatus of claim 10, wherein
a space is defined between the heat discharge member and the rib at the cut-away portion defined in the rib.

13. The display apparatus of claim 1, wherein
the flexible printed circuit board comprises a bent portion adjacent to the rib, and
the driving chip is on the bent portion of the flexible printed circuit board.

14. The display apparatus of claim 1, wherein the heat discharge member comprises a plate comprising a metal material.

15. The display apparatus of claim 1, wherein the heat discharge member comprises a heat conductive tape.

16. A method of manufacturing a display apparatus, the method comprising:
   providing a display panel which displays an image in a display area thereof;
   providing a driver which is electrically connected to the display panel, and applies a control signal to the display panel and controls an operation of the display panel;
   providing a first cover member which overlaps edges the display panel and comprises a nonmetal material; and
   providing a heat discharge member which is coupled to the first cover member, contacts the driver and discharges a heat generated by the driver,
   wherein the providing the first cover member comprises:
      providing a cover portion overlapping a non-display area of the display panel,
      providing an opening in the cover portion, the opening exposing the display area of the display panel,
      providing a side wall portion connected with the cover portion and extended along edges of the cover portion,
      providing a rib connected with the cover portion and spaced apart from the side wall portion to contact the heat discharge member, the rib defining:
         a first outer surface thereof facing the driver, and
         a second outer surface thereof opposite to the first sidewall thereof; and
      the heat discharge member covers the second outer surface of the rib which is opposite to the first outer surface thereof which faces the driver.

17. The method of claim 16, wherein the providing the sidewall portion comprises extended from the cover portion in a defining a first space between the rib and the sidewall portion.

18. The method of claim 17, wherein
the providing the driver comprises:
   connecting a driving circuit board which generates the control signal, to a first end of a flexible printed circuit board, and connecting the display panel to a second end of the flexible printed circuit board opposite to the first end; and
   providing a driving chip on the flexible printed circuit board,
the providing the heat discharge member comprises defining a second space between the rib and the heat discharge member, and
a portion of the heat discharge member is between the second space and the driving chip.

19. The method of claim 17, wherein
the providing the heat discharge member comprises defining a second space between the rib and a distal end of the heat discharge member.

* * * * *